(12) United States Patent
Wakabayashi

(10) Patent No.: US 11,237,019 B2
(45) Date of Patent: Feb. 1, 2022

(54) MAGNETIC SENSOR COMPRISING MAGNET AND INSERTABLE SENSOR PACKAGE HAVING ENCAPSULATION THAT ENCAPSULATES LEAD FRAMES AND MAGNETIC SENSOR ELEMENT

(71) Applicant: KABUSHIKI KAISHA TOKAI RIKA DENKI SEISAKUSHO, Aichi (JP)

(72) Inventor: Jyunya Wakabayashi, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 17/085,231

(22) Filed: Oct. 30, 2020

(65) Prior Publication Data
US 2021/0190540 A1 Jun. 24, 2021

(30) Foreign Application Priority Data

Dec. 23, 2019 (JP) .............................. JP2019-231210

(51) Int. Cl.
*G01D 5/12* (2006.01)
(52) U.S. Cl.
CPC ...................................... *G01D 5/12* (2013.01)
(58) Field of Classification Search
CPC ......... G01D 5/12–2525; G01D 11/245; G01R 33/00; G01R 33/0047
See application file for complete search history.

(56) References Cited

U.S. PATENT DOCUMENTS

| | | | | |
|---|---|---|---|---|
| 5,581,179 | A * | 12/1996 | Engel ................... | G01D 11/245 324/207.2 |
| 5,912,556 | A * | 6/1999 | Frazee ................... | G01D 5/145 324/207.2 |
| 7,816,772 | B2 * | 10/2010 | Engel ...................... | H01L 21/56 257/676 |

FOREIGN PATENT DOCUMENTS

JP 2018-036140 A 3/2018

\* cited by examiner

*Primary Examiner* — Huy Q Phan
*Assistant Examiner* — David B Frederiksen
(74) *Attorney, Agent, or Firm* — Greenblum & Bernstein, P.L.C.

(57) ABSTRACT

A magnetic sensor comprises a sensor package and a magnet. The sensor package includes a plurality of lead frames, a magnetic sensor element, and an encapsulation. The plurality of lead frames include a first outer lead and a second outer lead. The first outer lead has a first body and a first protrusion. The second outer lead has a second body and a second protrusion. The magnet includes a magnet body, a first restricting portion, a second restricting portion, a first receiving portion, and a second receiving portion.

5 Claims, 5 Drawing Sheets

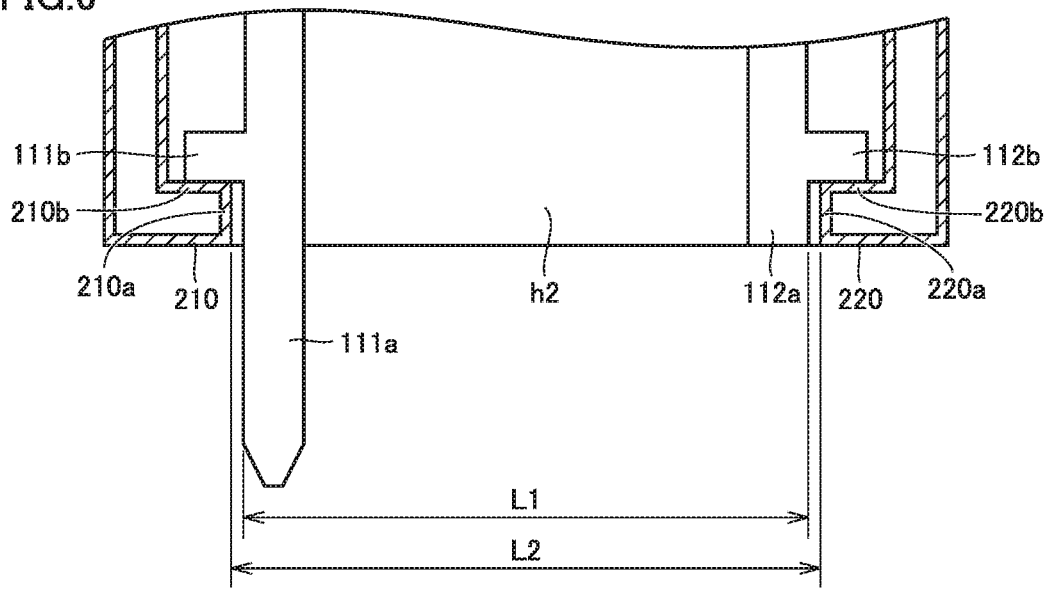

MAGNETIC SENSOR COMPRISING MAGNET AND INSERTABLE SENSOR PACKAGE HAVING ENCAPSULATION THAT ENCAPSULATES LEAD FRAMES AND MAGNETIC SENSOR ELEMENT

This nonprovisional application is based on Japanese Patent Application No. 2019-231210 filed on Dec. 23, 2019 with the Japan Patent Office, the entire contents of which are hereby incorporated by reference.

BACKGROUND OF THE INVENTION

Field of the Invention

The present disclosure relates to a magnetic sensor.

Description of the Background Art

Conventionally, a magnetic sensor has been known as a non-contact sensor. For example, Japanese Patent Laid-Open No. 2018-036140 discloses a magnetic sensor device comprising a magnetic sensor element and a magnet. The magnetic sensor element includes an electronic circuit section including a plurality of lead frames and a magnetic sensor, and an encapsulation that encapsulates the electronic circuit section. The magnet surrounds the magnetic sensor element. The magnetic sensor element is inserted into the magnet.

One of the plurality of lead frames has a first protrusion and a second protrusion. The first protrusion protrudes from the encapsulation on one side in a direction orthogonal to an inserting direction in which the magnetic sensor element is inserted into the magnet, and the second protrusion protrudes from the encapsulation on the other side in the direction orthogonal to the inserting direction.

The magnet has a first receiving portion and a second receiving portion. Each receiving portion is formed by a slit cut out from a front surface of the magnet toward a rear surface of the magnet. The first receiving portion receives the first protrusion when the magnetic sensor element is inserted into the magnet, and the second receiving portion receives the second protrusion when the magnetic sensor element is inserted into the magnet. Thus, the first protrusion contacts an end surface of the first receiving portion, and the second protrusion contacts an end surface of the second receiving portion. This determines a relative positional relationship between the magnetic sensor element and the magnet.

SUMMARY OF THE INVENTION

The magnetic sensor described in Japanese Patent Laid-Open No. 2018-036140 has room for improvement in accuracy in positioning the magnetic sensor element relative to the magnet in the direction orthogonal to the inserting direction.

It is an object of the present disclosure to provide a magnetic sensor capable of improving accuracy in positioning a sensor package relative to a magnet.

A magnetic sensor according to the present disclosure comprises a sensor package and a magnet surrounding a portion of the sensor package and having a shape allowing the sensor package to be inserted into the magnet, the sensor package including a plurality of lead frames, a magnetic sensor element connected to any one of the plurality of lead frames to sense a change in a magnetic field generated by the magnet, and an encapsulation that encapsulates the plurality of lead frames and the magnetic sensor element so as to expose a portion of the plurality of lead frames, the plurality of lead frames including a first outer lead exposed from the encapsulation and disposed at an end located on one side in a direction orthogonal to an inserting direction in which the sensor package is inserted into the magnet, and a second outer lead exposed from the encapsulation and disposed at an end located on the other side in the orthogonal direction, the first outer lead having a first body having a shape extending in the inserting direction and a first protrusion protruding from the first body outward in the orthogonal direction, the second outer lead having a second body having a shape extending in the inserting direction and a second protrusion protruding from the second body outward in the orthogonal direction, the magnet having a magnet body surrounding at least a portion of the encapsulation, a first restricting portion that restricts the first body displacing relative to the magnet body outward in the orthogonal direction, a second restricting portion that restricts the second body displacing relative to the magnet body outward in the orthogonal direction, a first receiving portion that receives the first protrusion on a side opposite to the inserting direction, and a second receiving portion that receives the second protrusion on the side opposite to the inserting direction.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 schematically shows a vicinity of a first protrusion and a second protrusion.

DESCRIPTION OF THE PREFERRED EMBODIMENTS

Hereinafter, an embodiment of the present disclosure will be described with reference to the drawings. In the figures referred to below, identical or equivalent members are identically denoted.

Figure 1:
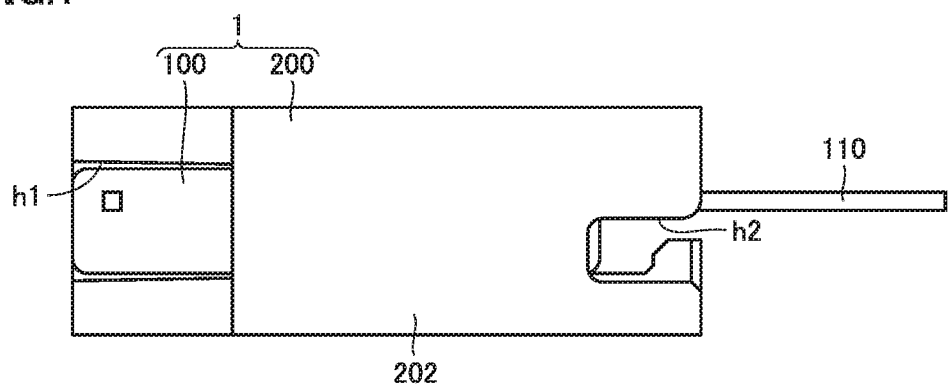
FIG. 1 is a left side view of a magnetic sensor according to an embodiment of the present disclosure.
Figure 2:
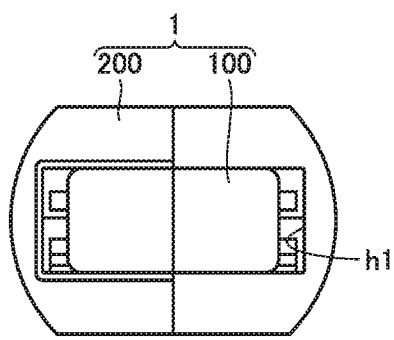
FIG. 2 is a plan view of the magnetic sensor shown in FIG. 1.

FIG. 1 is a left side view of a magnetic sensor according to an embodiment of the present disclosure. FIG. 2 is a plan view of the magnetic sensor shown in FIG. 1.

Figure 3:
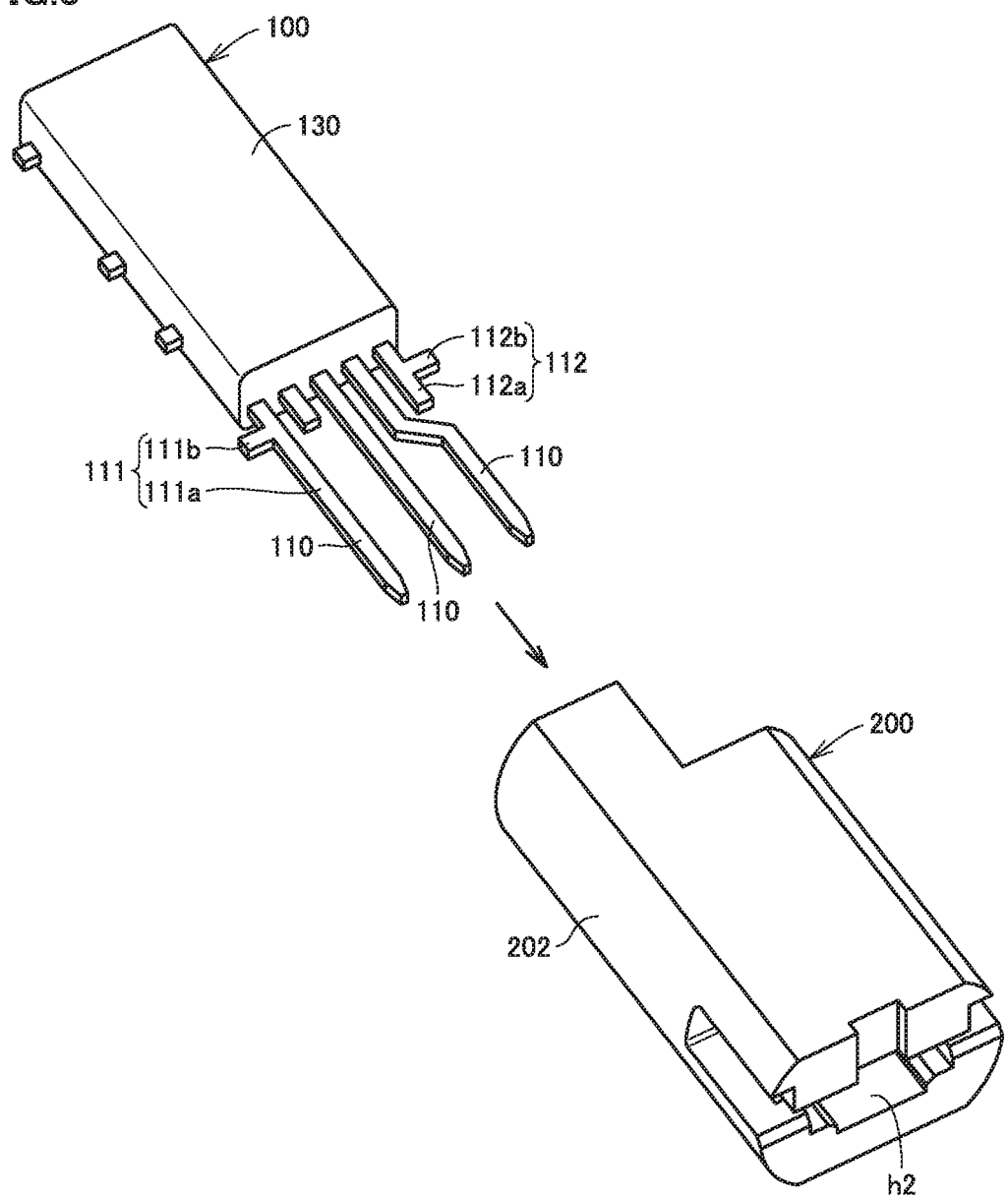
FIG. 3 shows a method for assembling a sensor package to a magnet.

FIG. 3 shows a method for assembling a sensor package to a magnet. Hereinafter, a direction in which a sensor package 100 is inserted into a magnet 200 (a direction indicated in FIG. 3 by an arrow) will be referred to as an "inserting direction."

As shown in FIGS. 1 to 3, a magnetic sensor 1 comprises sensor package 100 and magnet 200.

Sensor package 100 includes a plurality of lead frames 110, a magnetic sensor element 120, and an encapsulation 130.

Each lead frame 110 is made of a conductive metal and is formed in a plate.

Figure 4:
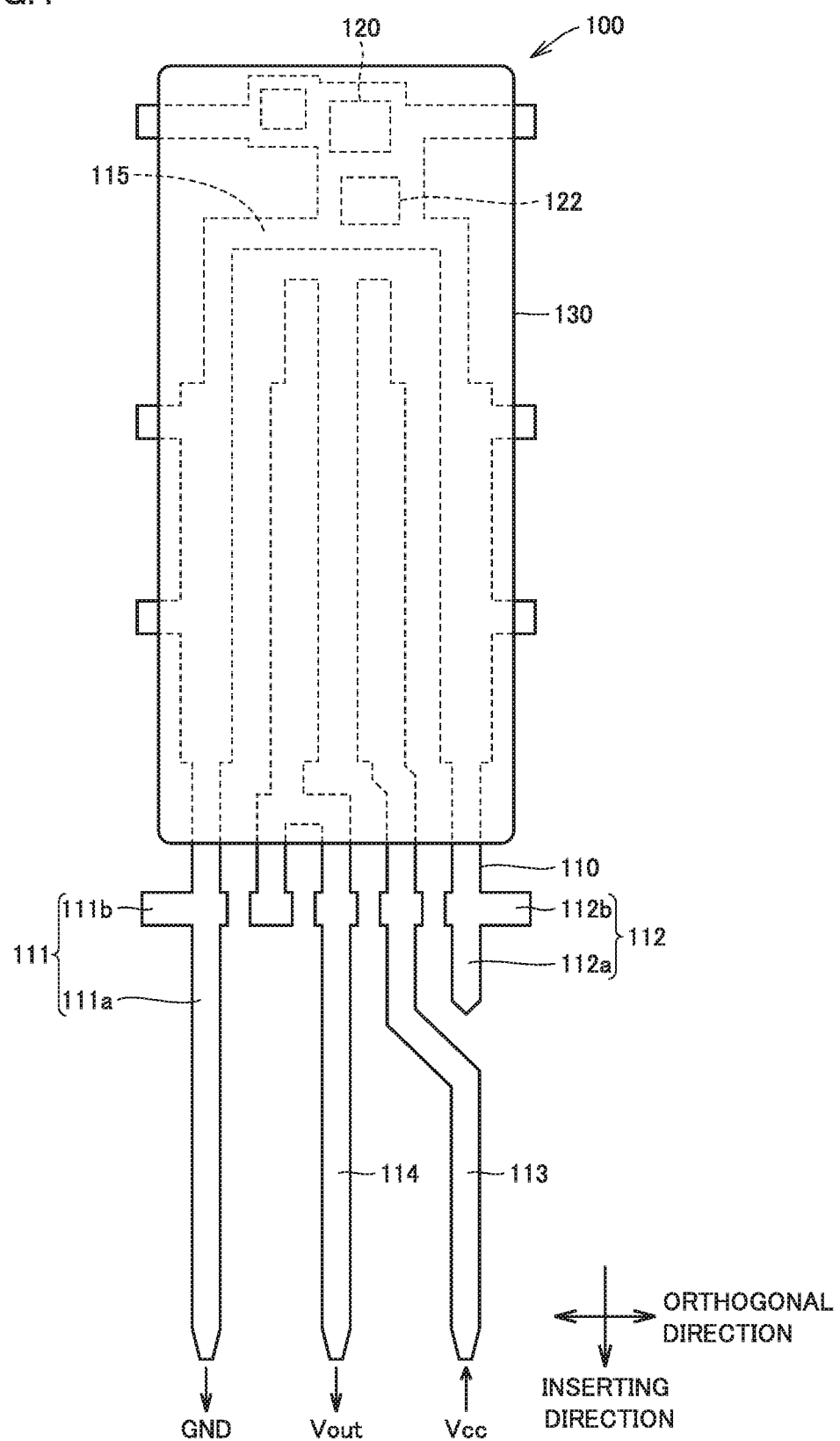
FIG. 4 is a front view of the sensor package.
Figure 5:
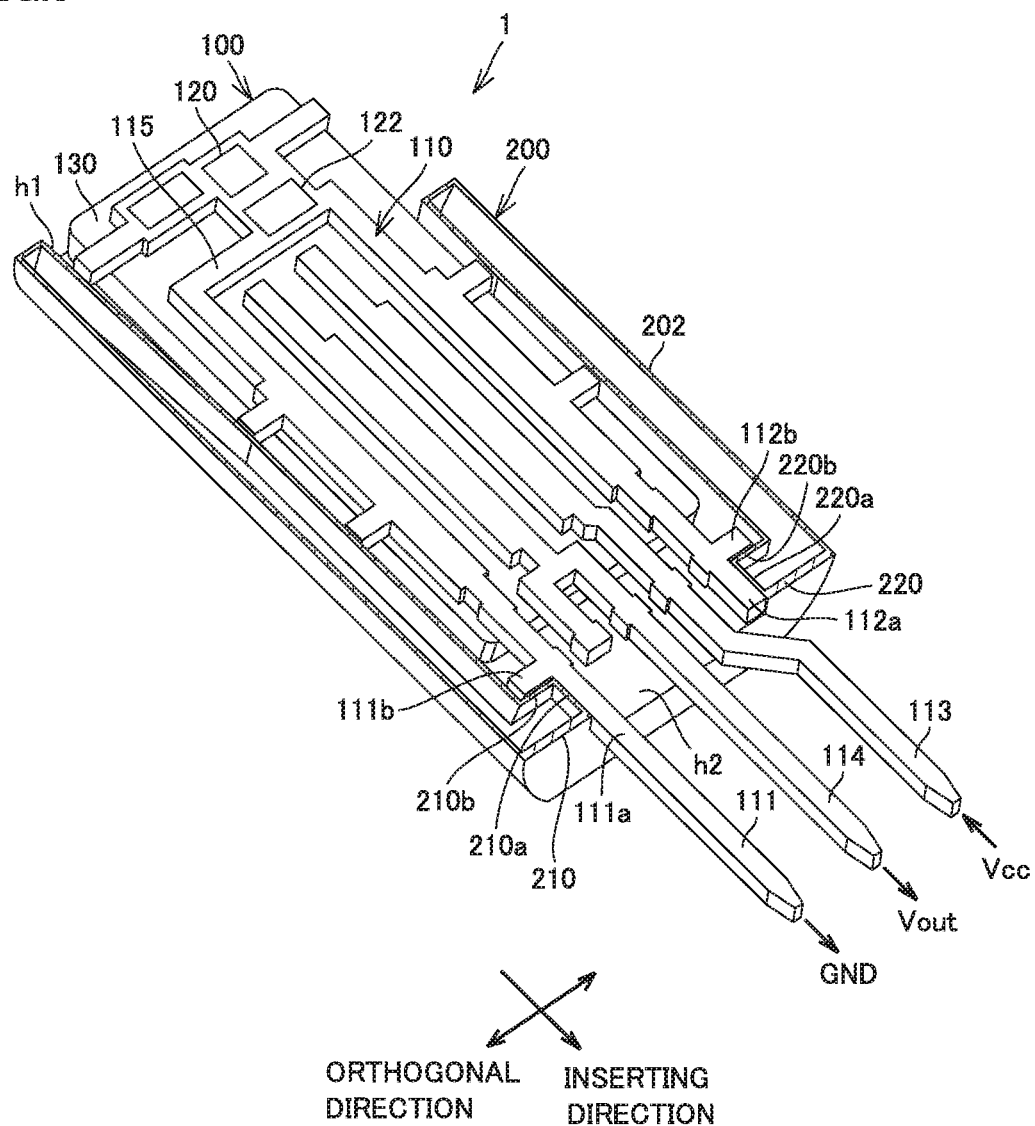
FIG. 5 is a perspective view schematically showing a cross section of the magnetic sensor.

As shown in FIGS. 3 to 5, encapsulation 130 encapsulates the plurality of lead frames 110 so as to expose a portion of the plurality of lead frames 110. Encapsulation 130 is made for example of resin.

A portion of the plurality of lead frames 110 exposed from encapsulation 130 constitutes an outer lead. Specifically, the plurality of lead frames 110 include a first outer lead 111, a second outer lead 112, a third outer lead 113, a fourth outer lead 114, and a coupling lead 115.

First outer lead 111 is disposed at an end located on one side in a direction orthogonal to the inserting direction (in FIG. 4, on a left side in a lateral direction). First outer lead 111 has a first body 111a and a first protrusion 111b.

First body 111a has a shape extending in a direction parallel to the inserting direction (or vertically in FIG. 4). First body 111a is connected to a connector of what first body 111a is connected to. Specifically, first body 111a is connected to a circuit of the connector at a terminal set to the ground potential. That is, first body 111a serves as a ground terminal by being connected to the connector.

First protrusion 111b has a shape protruding from first body 111a outward in the orthogonal direction (or leftward in FIG. 4). First protrusion 111b has a protruding dimension smaller than the length of first body 111a.

Second outer lead 112 is disposed at an end located on the other side in the orthogonal direction (or rightward in FIG. 4). Second outer lead 112 has a second body 112a and a second protrusion 112b.

Second body 112a has a shape extending in a direction parallel to the inserting direction. In the inserting direction, second body 112a is smaller in length than first body 111a. Second body 112a is not connected to the connector.

Second protrusion 112b has a shape protruding from second body 112a outward in the orthogonal direction (or rightward in FIG. 4). In the present embodiment, second protrusion 112b protrudes outward in the orthogonal direction from a portion of second body 112a that aligns with first protrusion 111b in the orthogonal direction. Note, however, that second protrusion 112b may protrude outward in the orthogonal direction from a portion of second body 112a offset in a direction parallel to the inserting direction from the portion of second body 112a that aligns with the first protrusion 111b in the orthogonal direction. Second protrusion 112b has a protruding dimension smaller than the length of second body 112a.

Third outer lead 113 is disposed at a position adjacent to second outer lead 112 in the orthogonal direction. Third outer lead 113 is connected to the circuit of the connector at a terminal which supplies reference voltage Vcc.

Fourth outer lead 114 is disposed at a position adjacent to third outer lead 113 in the orthogonal direction. Fourth outer lead 114 is a terminal which outputs output voltage Vout to the circuit of the connector.

Coupling lead 115 couples first outer lead 111 and second outer lead 112 together. Coupling lead 115 is disposed inside encapsulation 130. That is, coupling lead 115 constitutes an inner lead.

While in the above description the plurality of lead frames 110 have three outer leads 111, 113, and 114 by way of example, the plurality of lead frames 110 are not limited in configuration to the above example.

Magnetic sensor element 120 is connected to any one of the plurality of lead frames 110. Specifically, magnetic sensor element 120 is connected to coupling lead 115. Magnetic sensor element 120 senses a change in a magnetic field generated by magnet 200.

In the present embodiment, in addition to magnetic sensor element 120, a control IC 122 and the like are also connected to coupling lead 115. Magnetic sensor element 120, control IC 122, and the like are encapsulated by encapsulation 130. Control IC 122 is connected to magnetic sensor element 120, an inner lead connected to third outer lead 113 of the plurality of lead frames 110, an inner lead connected to fourth outer lead 114 of the plurality of lead frames 110, and coupling lead 115 by a wire (not shown).

Magnet 200 surrounds a portion of sensor package 100. Magnet 200 is formed tubularly. Magnet 200 has a first opening h1 and a second opening h2. As shown in FIG. 3, sensor package 100 is inserted into magnet 200 in the inserting direction from first opening h1 toward second opening h2 (i.e., a direction indicated in FIG. 3 by an arrow). Examples of magnet 200 include a permanent magnet and a plastic magnet. As shown in FIG. 5, magnet 200 includes a magnet body 202, a first flange 210, and a second flange 220.

Magnet body 202 surrounds at least a portion of that portion of sensor package 100 which is encapsulated by encapsulation 130. An end of magnet body 202 located on a side provided with first opening h1 is partially notched.

First flange 210 has a shape projecting toward first outer lead 111 from a portion of that end of magnet body 202 which is frontward in the inserting direction facing first outer lead 111 in the orthogonal direction. First flange 210 includes a first restricting portion 210a and a first receiving portion 210b.

First restricting portion 210a is composed of a portion of first flange 210 facing first body 111a in the orthogonal direction. First restricting portion 210a restricts first body 111a displacing relative to magnet body 202 outward in the orthogonal direction. First receiving portion 210b is composed of a portion of first flange 210 facing first protrusion 111b in the inserting direction. First receiving portion 210b receives first protrusion 111b on a side opposite to the inserting direction.

Second flange 220 has a shape projecting toward second outer lead 112 from a portion of that end of magnet body 202 which is frontward in the inserting direction facing second outer lead 112 in the orthogonal direction. Second flange 220, together with first flange 210, configures a portion of a portion defining second opening h2. Second flange 220 has a second restricting portion 220a and a second receiving portion 220b.

Second restricting portion 220a is composed of a portion of second flange 220 facing second body 112a in the orthogonal direction. Second restricting portion 220a restricts second body 112a displacing relative to magnet body 202 outward in the orthogonal direction. First restricting portion 210a and second restricting portion 220a restrict sensor package 100 displacing relative to magnet body 202 in the orthogonal direction.

Second receiving portion 220b is composed of a portion of second flange 220 facing second protrusion 112b in the inserting direction. Second receiving portion 220b receives second protrusion 112b on a side opposite to the inserting direction. First receiving portion 210b and second receiving portion 220b determine a position of sensor package 100 with respect to magnet body 202 in the inserting direction.

Magnet 200 assumes a ground potential as first protrusion 111b abuts against first receiving portion 210b and second protrusion 112b abuts against second receiving portion 220b.

As shown in FIG. 6, a distance L2 between first restricting portion 210a and second restricting portion 220a in the orthogonal direction is set to be slightly larger than a distance L1 between an outer end of first body 111a and an outer end of second body 112a in the orthogonal direction. Note, however, that distance L2 may be set to be equal to distance L1. In FIG. 6, third outer lead 113 and fourth outer lead 114 are not shown.

As has been described above, in magnetic sensor 1 of the present embodiment, first protrusion 111b abuts against first receiving portion 210b in the inserting direction and second protrusion 112b abuts against second receiving portion 220b in the inserting direction, and a positional relationship between sensor package 100 and magnet 200 in the inserting direction is effectively determined, and furthermore, first restricting portion 210a of magnet 200 restricts first body 111a displacing relative to magnet body 202 outward in the orthogonal direction and second restricting portion 220a restricts second body 112a displacing relative to magnet body 202 outward in the orthogonal direction, and a positional relationship between sensor package 100 and magnet 200 in the orthogonal direction is effectively determined. Sensor package 100 can thus be positioned relative to magnet 200 with increased accuracy.

An exemplary embodiment described above is a specific example of the following aspects.

In one aspect, a magnetic sensor comprises a sensor package and a magnet surrounding a portion of the sensor package and having a shape allowing the sensor package to be inserted into the magnet, the sensor package including a plurality of lead frames, a magnetic sensor element connected to any one of the plurality of lead frames to sense a change in a magnetic field generated by the magnet, and an encapsulation that encapsulates the plurality of lead frames and the magnetic sensor element so as to expose a portion of the plurality of lead frames, the plurality of lead frames including a first outer lead exposed from the encapsulation and disposed at an end located on one side in a direction orthogonal to an inserting direction in which the sensor package is inserted into the magnet, and a second outer lead exposed from the encapsulation and disposed at an end located on the other side in the orthogonal direction, the first outer lead having a first body having a shape extending in the inserting direction and a first protrusion protruding from the first body outward in the orthogonal direction, the second outer lead having a second body having a shape extending in the inserting direction and a second protrusion protruding from the second body outward in the orthogonal direction, the magnet having a magnet body surrounding at least a portion of the encapsulation, a first restricting portion that restricts the first body displacing relative to the magnet body outward in the orthogonal direction, a second restricting portion that restricts the second body displacing relative to the magnet body outward in the orthogonal direction, a first receiving portion that receives the first protrusion on a side opposite to the inserting direction, and a second receiving portion that receives the second protrusion on the side opposite to the inserting direction.

Preferably, the second protrusion protrudes outward in the orthogonal direction from a portion of the second body that aligns with the first protrusion in the orthogonal direction.

This facilitates generating a desired magnetic field.

Further, the magnet may further have a first flange projecting toward the first outer lead from a portion of that end of the magnet body which is frontward in the inserting direction facing the first outer lead in the orthogonal direction, and a second flange projecting toward the second outer lead from a portion of that end of the magnet body which is frontward in the inserting direction facing the second outer lead in the orthogonal direction. In that case, preferably, a portion of the first flange facing the first body in the orthogonal direction configures the first restricting portion, a portion of the first flange facing the first protrusion in the inserting direction configures the first receiving portion, a portion of the second flange facing the second body in the orthogonal direction configures the second restricting portion, and a portion of the second flange facing the second protrusion in the inserting direction configures the second receiving portion.

Preferably, the first outer lead and the second outer lead are set to a ground potential.

In this aspect, the magnet in contact with the first outer lead and the second outer lead also has the ground potential. Accordingly, the magnet serves as a shield, and the sensor package is more resistant to electrical noise.

Preferably, the plurality of lead frames include a coupling lead to couple the first outer lead and the second outer lead, and the magnetic sensor element is mounted to the coupling lead.

It should be understood that the presently disclosed embodiments are illustrative and not restrictive in any respect. The scope of the present invention is defined by the terms of the claims and intended to encompass any modifications within a meaning and scope equivalent to the terms of the claims.

What is claimed is:

1. A magnetic sensor comprising:
   a sensor package; and
   a magnet surrounding a portion of the sensor package and having a shape allowing the sensor package to be inserted into the magnet,
   the sensor package including:
      a plurality of lead frames;
      a magnetic sensor element connected to any one of the plurality of lead frames and sensing a change in a magnetic field generated by the magnet; and
      an encapsulation that encapsulates the plurality of lead frames and the magnetic sensor element so as to expose a portion of the plurality of lead frames,
   the plurality of lead frames including:
      a first outer lead exposed from the encapsulation and disposed at an end located on one side in a direction orthogonal to an inserting direction in which the sensor package is inserted into the magnet; and
      a second outer lead exposed from the encapsulation and disposed at an end located on an other side in the orthogonal direction,
   the first outer lead having:
      a first body having a shape extending in the inserting direction; and
      a first protrusion protruding from the first body outward in the orthogonal direction,
   the second outer lead having:
      a second body having a shape extending in the inserting direction; and
      a second protrusion protruding from the second body outward in the orthogonal direction,
   the magnet including:
      a magnet body surrounding at least a portion of the encapsulation;
      a first restricting portion that restricts the first body displacing relative to the magnet body outward in the orthogonal direction;

a second restricting portion that restricts the second body displacing relative to the magnet body outward in the orthogonal direction;

a first receiving portion that receives the first protrusion on a side opposite to the inserting direction; and a second receiving portion that receives the second protrusion on the side opposite to the inserting direction.

2. The magnetic sensor according to claim 1, wherein the second protrusion protrudes outward in the orthogonal direction from a portion of the second body that aligns with the first protrusion in the orthogonal direction.

3. The magnetic sensor according to claim 1, wherein the magnet further has a first flange projecting toward the first outer lead from a portion of that end of the magnet body which is frontward in the inserting direction facing the first outer lead in the orthogonal direction, and a second flange projecting toward the second outer lead from a portion of that end of the magnet body which is frontward in the inserting direction facing the second outer lead in the orthogonal direction, and a portion of the first flange facing the first body in the orthogonal direction configures the first restricting portion, a portion of the first flange facing the first protrusion in the inserting direction configures the first receiving portion, a portion of the second flange facing the second body in the orthogonal direction configures the second restricting portion, and a portion of the second flange facing the second protrusion in the inserting direction configures the second receiving portion.

4. The magnetic sensor according to claim 1, wherein the first outer lead and the second outer lead are set to a ground potential.

5. The magnetic sensor according to claim 1, wherein the plurality of lead frames include a coupling lead to couple the first outer lead and the second outer lead together, and the magnetic sensor element is mounted to the coupling lead.

* * * * *